(12) United States Patent
Lee

(10) Patent No.: US 11,416,425 B2
(45) Date of Patent: Aug. 16, 2022

(54) MEMORY

(71) Applicant: SK hynix Inc., Icheon-si (KR)

(72) Inventor: Dong-Uk Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 13 days.

(21) Appl. No.: 16/841,466

(22) Filed: Apr. 6, 2020

(65) Prior Publication Data

US 2021/0109873 A1  Apr. 15, 2021

(30) Foreign Application Priority Data

Oct. 10, 2019  (KR) ........................ 10-2019-0125044

(51) Int. Cl.
| | |
|---|---|
| *G06F 13/16* | (2006.01) |
| *G06F 3/06* | (2006.01) |
| *H01L 25/18* | (2006.01) |
| *G11C 7/10* | (2006.01) |
| *G11C 7/22* | (2006.01) |
| *H01L 25/065* | (2006.01) |
| *H03M 9/00* | (2006.01) |

(52) U.S. Cl.
CPC ........ *G06F 13/1668* (2013.01); *G06F 3/0604* (2013.01); *G06F 3/0635* (2013.01); *G06F 3/0659* (2013.01); *G06F 3/0673* (2013.01); *G11C 7/1069* (2013.01); *G11C 7/222* (2013.01); *H01L 25/0657* (2013.01); *H01L 25/18* (2013.01); *H01L 2225/06541* (2013.01); *H03M 9/00* (2013.01)

(58) Field of Classification Search
CPC .. G06F 13/1668; G06F 3/0604; G06F 3/0635; G06F 3/0659; G06F 3/0673; G11C 7/1069; G11C 7/222; H01L 25/0657; H01L 25/18; H01L 2225/06541; H03M 9/00

See application file for complete search history.

(56) References Cited

U.S. PATENT DOCUMENTS

| | | | | |
|---|---|---|---|---|
| 5,598,526 | A * | 1/1997 | Daniel | ................... G09G 5/393 |
| | | | | 345/27 |
| 5,729,709 | A * | 3/1998 | Harness | ............. G06F 13/1647 |
| | | | | 711/5 |
| 5,835,436 | A * | 11/1998 | Ooishi | ................. G11C 7/1006 |
| | | | | 365/230.03 |
| 5,835,443 | A * | 11/1998 | Fujita | ................... G11C 7/1093 |
| | | | | 365/233.1 |
| 5,875,470 | A * | 2/1999 | Dreibelbis | ............... G11C 7/18 |
| | | | | 711/147 |
| 6,785,168 | B2 | 8/2004 | Toon | |
| 7,120,081 | B2 | 10/2006 | Lee | |

(Continued)

*Primary Examiner* — Henry Tsai
*Assistant Examiner* — Aurangzeb Hassan
(74) *Attorney, Agent, or Firm* — William Park & Associates Ltd.

(57) ABSTRACT

A memory includes: a first data bus; a second data bus; and a plurality of bank groups. The bank groups output read data by alternately using the first data bus and the second data bus during read operations of the bank groups. One of the plurality of bank groups transfer read data to the first data bus during a read operation based on an odd-numbered read command. Further, one of the plurality of bank groups transfer transfer one of the plurality of bank groups read data to the second data bus during a read operation based on an even-numbered read command.

12 Claims, 6 Drawing Sheets

(56) References Cited

U.S. PATENT DOCUMENTS

| | | | |
|---|---|---|---|
| 9,552,255 B2 | 1/2017 | Kim et al. | |
| 2008/0123461 A1* | 5/2008 | Kim | G11C 7/18 |
| | | | 365/230.03 |
| 2009/0016146 A1* | 1/2009 | Fujisawa | G11C 7/222 |
| | | | 365/233.1 |
| 2012/0105119 A1* | 5/2012 | Kim | H03L 7/0816 |
| | | | 327/158 |
| 2012/0254528 A1* | 10/2012 | Na | G06F 13/00 |
| | | | 711/105 |
| 2017/0109308 A1* | 4/2017 | Kim | G11C 8/12 |
| 2017/0206973 A1* | 7/2017 | Sudo | G11C 16/10 |
| 2020/0243158 A1* | 7/2020 | Wilson | G11C 17/18 |

* cited by examiner

MEMORY

CROSS-REFERENCE TO RELATED APPLICATIONS

The present application claims priority of Korean Patent Application No. 10-2019-0125044, filed on Oct. 10, 2019, which is incorporated herein by reference in its entirety.

BACKGROUND

1. Technical Field

Embodiments of the present disclosure generally relate to a memory and a memory system.

2. Related Art

As semiconductor memory technology is rapidly progressing, high integration and high performance are required for packaging technology of semiconductor devices as well. Accordingly, various technologies have been developed for a three-dimensional structure in which a plurality of integrated circuit chips are vertically stacked, instead of a two-dimensional structure in which integrated circuit chips are planarly disposed on a printed circuit board (PCB) using wires or bumps.

Such a three-dimensional structure may be realized through a stacked memory device in which a plurality of memory chips are vertically stacked. The memory chips stacked in the vertical direction are electrically connected to each other through a Through Silicon Via (TSV) and mounted on a semiconductor package substrate.

SUMMARY

In accordance with an embodiment, a memory may include: a first data bus; a second data bus; and first to fourth bank groups each of which includes one or more memory banks, wherein the first to fourth bank groups transfer read data to the first data bus during a read operation based on an odd-numbered read command, and transfer read data to the second data bus during a read operation based on an even-numbered read command.

In accordance with an embodiment, a memory may include: a plurality of bank groups each of which includes a plurality of memory banks; a first data bus; and a second data bus, wherein the bank groups output read data by alternately using the first data bus and the second data bus during read operations of the bank groups.

DETAILED DESCRIPTION

Figure 1:
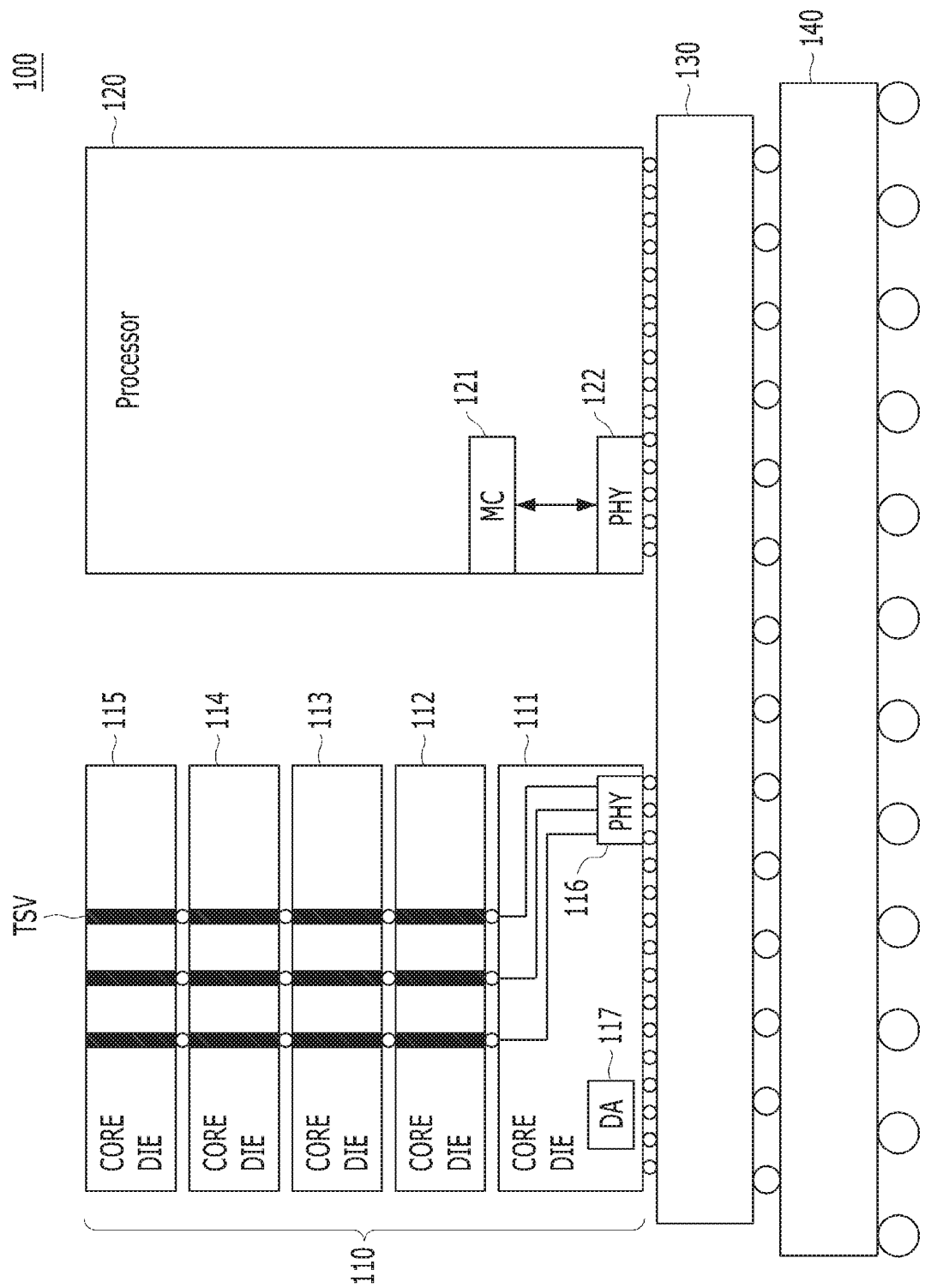
FIG. 1 is a block diagram illustrating a memory system including a High Bandwidth Memory (HBM).

Examples of embodiments will be described below in with reference to the accompanying drawings. The embodiments may, however, be embodied in different forms and should not be construed as limited to the embodiments set forth herein. Rather, these embodiments are provided so that this disclosure will be thorough and complete, and will convey the scope of the present disclosure to those skilled in the art. Throughout the disclosure, like reference numerals refer to like parts throughout the various figures and embodiments of the present disclosure.

FIG. 1 is a diagram illustrating a memory system 100 including a High Bandwidth Memory (HBM). In an embodiment a semiconductor device may include a memory system 100.

Referring to FIG. 1, the memory system 100 may include a high bandwidth memory 110, a processor 120, an interposer 130, and a package substrate 140.

The interposer 130 may be formed over the package substrate 140, and the high bandwidth memory 110 and the processor 120 may be formed over the interposer 130.

The processor 120 may include a memory controller 121 and a physical layer (PHY) interface 122 for interfacing with the memory controller 121. The PHY interface 122 may be used by the memory controller 121 to communicate with the high bandwidth memory 110. The processor 120 may be one among various processors, such as a Graphic Processing Unit (GPU), a Central Processing Unit (CPU), and an Application Processor (AP).

The high bandwidth memory 110 may include a logic die 111 and core dies 112 to 115 that are stacked over the logic die 111. Each of the core dies 112 to 115 may include a cell array for storing data and circuits for writing data into the cell array and reading the data from the cell array. The logic die 111 may include circuits for interface between the core dies 112 to 115 and the logic die 111 and circuits for interface between the logic die 111 and the memory controller 121. The logic die 111 may also be referred to as a base die. A plurality of Through Silicon Vias TSV may be formed between the stacked core dies 112 to 115, and thus, a command, an address, and data may be transferred between the core dies 112 to 115 and the logic die 111.

The PHY interface 116 of the logic die 111 may be an interface for communication between the logic die 111 and the memory controller 121, and the direct access (DA) interface 117 may be an interface for testing the high bandwidth memory 110. The PHY interface 116 may be coupled to the interposer 130 through micro bumps, and a wire inside the interposer 130 may electrically connect the PHY interface 116 of the logic die 111 and the PHY interface 122 of the memory controller 121. In other words, the PHY interfaces 116 and 122 may be electrically connected for communication through the interposer 130. The PHY interface 116 may be coupled to the interposer 130 via 1000 or more micro bumps. The physical number of the micro bumps is so great that it is practically very difficult to test the high bandwidth memory 110 with the PHY interface 116. For this reason, the DA interface 117, which performs interfacing by using direct access pads the physical size of which is relatively larger and the number of which is less than the number of the micro bumps, may be used for the test of the high bandwidth memory 110.

The package substrate 140 may include solder balls for supplying power to the high bandwidth memory 110 and the processor 120 and solder balls for the processor 120 to communicate with the outside (e.g., other chips on a graphic card). The package substrate 140 may be coupled to, for example, a graphic card.

There are many bank groups included in the core dies 112 to 115 of the high bandwidth memory 110. When data buses are provided as many as the bank groups in the core dies 112 to 115, there is a problem that the area for the data buses becomes too large Therefore, it is required to develop a technology for efficiently using the data bus.

Embodiments may be directed to a technology for efficiently using the data bus in a memory.

Figure 2:
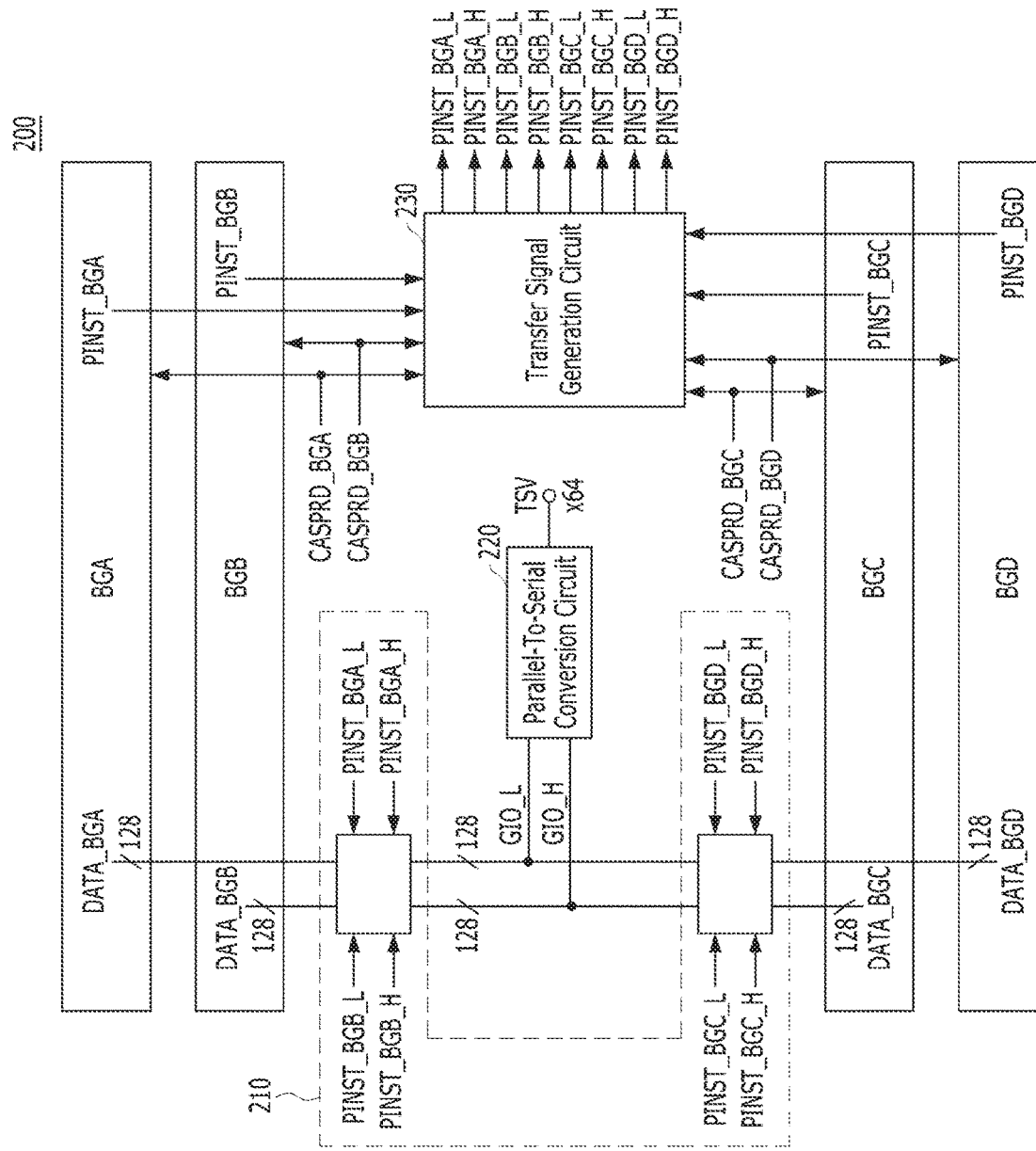
FIG. 2 is a block diagram illustrating a core die of a high bandwidth memory in accordance with an embodiment.

FIG. 2 is a block diagram illustrating a core die 200 of a high bandwidth memory in accordance with an embodiment.

Referring to FIG. 2, the core die 200 may include bank groups BGA to BGD, a first data bus GIO_L, a second data bus GIO_H, a bus control circuit 210, and a parallel-to-serial conversion circuit 220, and a transfer signal generation circuit 230.

Each of the first to fourth bank groups BGA to BGD may include a plurality of memory banks. For example, four memory banks may be included in each of the bank group BGA to BGD. Each of the memory banks may include a plurality of memory cells for storing data.

In one read operation, a read operation may be performed in one bank group among the first to fourth bank groups BGA to BGD. First to fourth bank group read signals CASPRD_BGA to CASPRD_BGD may be signals that direct the corresponding bank groups to perform a read operation. For example, when the second bank group read signal CASPRD_BGB is activated, a read operation of the second bank group BGB may be performed in response to the activated second bank group read signal CASPRD_BGB. When the fourth bank group read signal CASPRD_BGD is activated, a read operation of the fourth bank group BGD may be performed in response to the activated fourth bank group read signal CASPRD_BGD. First to fourth bank group pinstrobe signals PINST_BGA to PINST_BGD may be signals that are activated when read data are outputted from the corresponding bank group. For example, at a moment when read data DATA_BGA are outputted from the first bank group BGA, the first bank group BGA may activate the first bank group pinstrobe signal PINST_BGA. At a moment when read data DATA_BGC are outputted from the third bank group BGC, the third bank group BGC may activate the third bank group pinstrobe signal PINST_BGC.

The first data bus GIO_L and the second data bus GIO_H may be data buses for transferring the read data of the first to fourth bank groups BGA to BGD. In the read operation of the first to fourth bank groups BGA to BGD, the first data bus GIO_L and the second data bus GIO_H may be alternately used. For example, the first data bus GIO_L may be used in an odd-numbered read operation, and the second data bus GIO_H may be used in an even-numbered read operation. For example, when the read operation is performed in the order of (1) the second bank group BGB, (2) the fourth bank group BGD, and (3) the first bank group BGA, (1) the second bank group BGB may output read data DATA_BGB by using the first data bus GIO_L, and (2) the fourth bank group BGD may output read data DATA_BGD by using the second data bus GIO_H, and (3) the first bank group BGA may output read data DATA_BGA by using the first data bus GIO_L.

Each of the first data bus GIO_L and the second data bus GIO_H may include 128 lines. This is because 128 bits of data are outputted from a bank group that performs a read operation among the first to fourth bank groups BGA to BGD in a read operation. When the number of bits of read data outputted from a bank group that performs a read operation is changed in a read operation, the number of lines of the first data bus GIO_L and the second data bus GIO_H may be changed.

The bus control circuit 210 may control the coupling between the first to fourth bank groups BGA to BGD and the first data bus GIO_L and the second data bus GIO_H. As described above, the bus control circuit 210 may control the coupling between the first to fourth bank groups BGA to BGD and the data buses GIO_L and GIO_H so that the first data bus GIO_L and the second data bus GIO_H may be alternately used during the read operation of the first to fourth bank groups BGA to BGD. The bus control circuit 210 may be controlled based on first to eighth transfer signals PINST_BGA_L, PINST_BGA_H, PINST_BGB_L, PINST_BGB_H, PINST_BGC_L, PINST_BGC_H, PINST_BGD_L, and PINST_BGD_H. The structure and operation of the bus control circuit 210 will be described with reference to FIG. 3.

The transfer signal generation circuit 230 may generate the first to eighth transfer signals PINST_BGA_L, PINST_BGA_H, PINST_BGB_L, PINST_BGB_H, PINST_BGC_L, PINST_BGC_H, PINST_BGD_L, and PINST_BGD_H that control the bus control circuit 210. The transfer signal generation circuit 230 may generate the first to eighth transfer signals PINST_BGA_L, PINST_BGA_H, PINST_BGB_L, PINST_BGB_H, PINST_BGC_L, PINST_BGC_H, PINST_BGD_L, and PINST_BGD_H by using the first to fourth bank group read signals CASPRD_BGA to CASPRD_BGD and the first to fourth bank group pinstrobe signals PINST_BGA to PINST_BGD. The structure and operation of the transfer signal generation circuit 230 will be described with reference to FIG. 4.

The parallel-to-serial conversion circuit 220 may perform parallel-to-serial conversion on the read data transferred to the first data bus GIO_L and the second data bus GIO_H. The parallel-to-serial conversion circuit 220 may transfer the data obtained as a result of the parallel-to-serial conversion to a logic die through a Silicon Through Via (TSV). The parallel-to-serial conversion circuit 220 may alternately perform a 2:1 parallel-to-serial conversion on the read data of the first data bus GIO_L and the read data of the second data bus GIO_H and transfer the resultant serial data through silicon through vias TSVs. Therefore, the number of silicon through vias TSVs may be 64. The logic die may transfer the read data received through the silicon through vias TSVs to the memory controller. It is also possible to design the data of the first data bus GIO_L and the data of the second data bus GIO_H to be transferred through the silicon through vias TSVs as they are without a parallel-to-serial conversion being performed. In this case, the number of the silicon through vias TSVs may be 128. The structure and operation of the parallel-to-serial conversion circuit 220 will be described with reference to FIG. 5.

FIG. 2 illustrates a case where the technology of the present disclosure, in which a plurality of bank groups BGA to BGD alternately use the data buses GIO_L and GIO_H, is applied to a core die of a high bandwidth memory. In an embodiment, the technology of the present disclosure may be applied to general memories. Bank groups may be able to alternately use two or more data buses by changing the data bus used by each bank group for each read operation in all kinds of memories including a plurality of bank groups.

Figure 3:
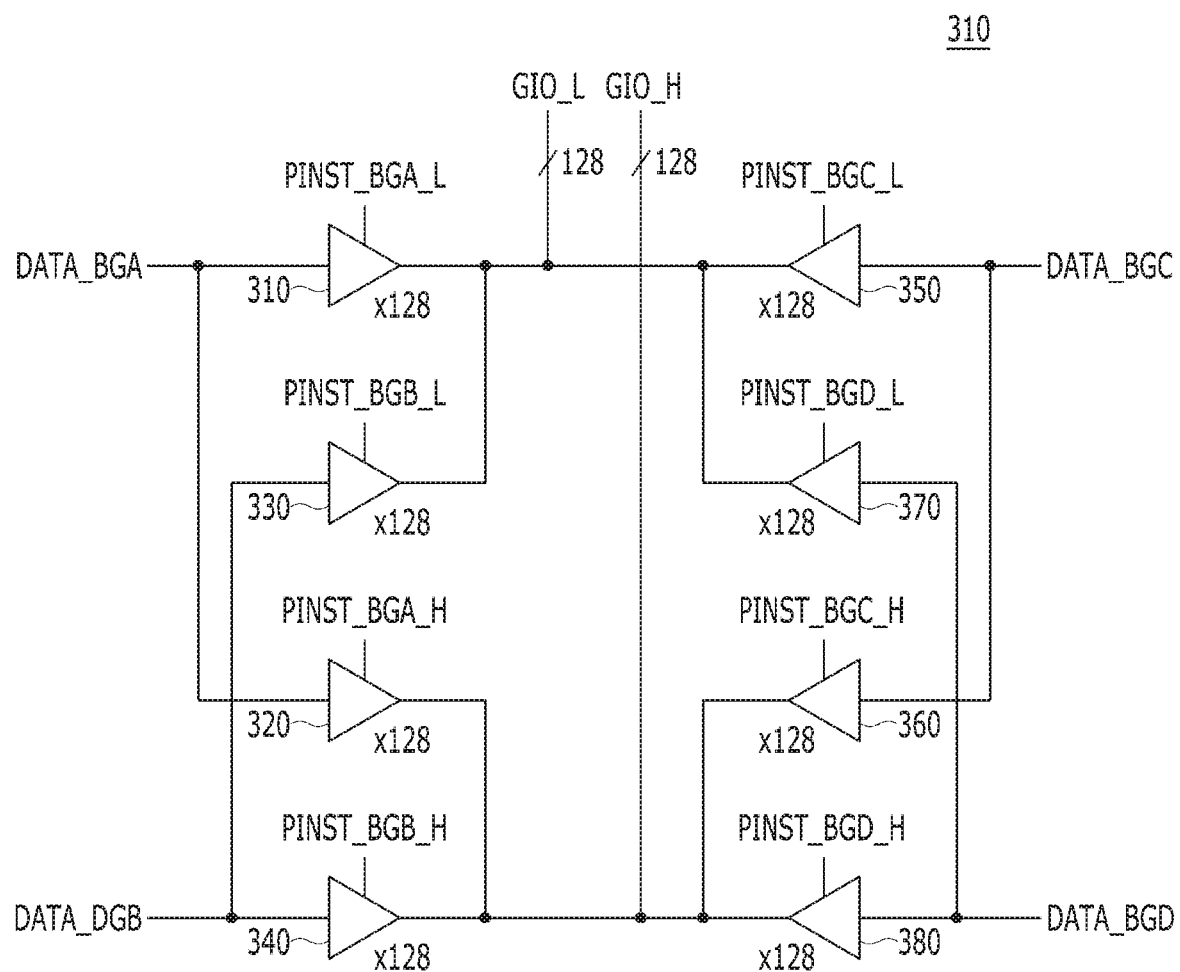
FIG. 3 is a block diagram illustrating a bus control circuit of FIG. 2.

FIG. 3 is a block diagram illustrating the bus control circuit 210 of FIG. 2.

Referring to FIG. 3, the bus control circuit 210 may include first to eighth transfer units 310 to 380.

The first transfer unit 310 may transfer the read data DATA_BGA of the first bank group to the first data bus GIO_L in response to the first transfer signal PINST_BGA_L, that is, upon activation of the first transfer signal PINST_BGA_L. The second transfer unit 320 may transfer the read data DATA_BGA of the first bank group to the second data bus GIO_H in response to the second transfer signal PINST_BGA_H.

The third transfer unit 330 may transfer the read data DATA_BGB of the second bank group to the first data bus GIO_L in response to the third transfer signal PINST_BGB_L. The fourth transfer unit 340 may transfer the read data DATA_BGB of the second bank group to the second data bus GIO_H in response to the fourth transfer signal PINST_BGB_H. The fifth transfer unit 350 may transfer the read data DATA_BGC of the third bank group to the first data bus GIO_L in response to the fifth transfer signal PINST_BGC_L. The sixth transfer unit 360 may transfer the read data DATA_BGC of the third bank group to the second data bus GIO_H in response to the sixth transfer signal PINST_BGC_H. The seventh transfer unit 370 may transfer the read data DATA_BGD of the fourth bank group to the first data bus GIO_L in response to the seventh transfer signal PINST_BGD_L. The eighth transfer unit 380 may transfer the read data DATA_BGD of the fourth bank group to the second data bus GIO_H in response to the eighth transfer signal PINST_BGD_H.

Figure 4:
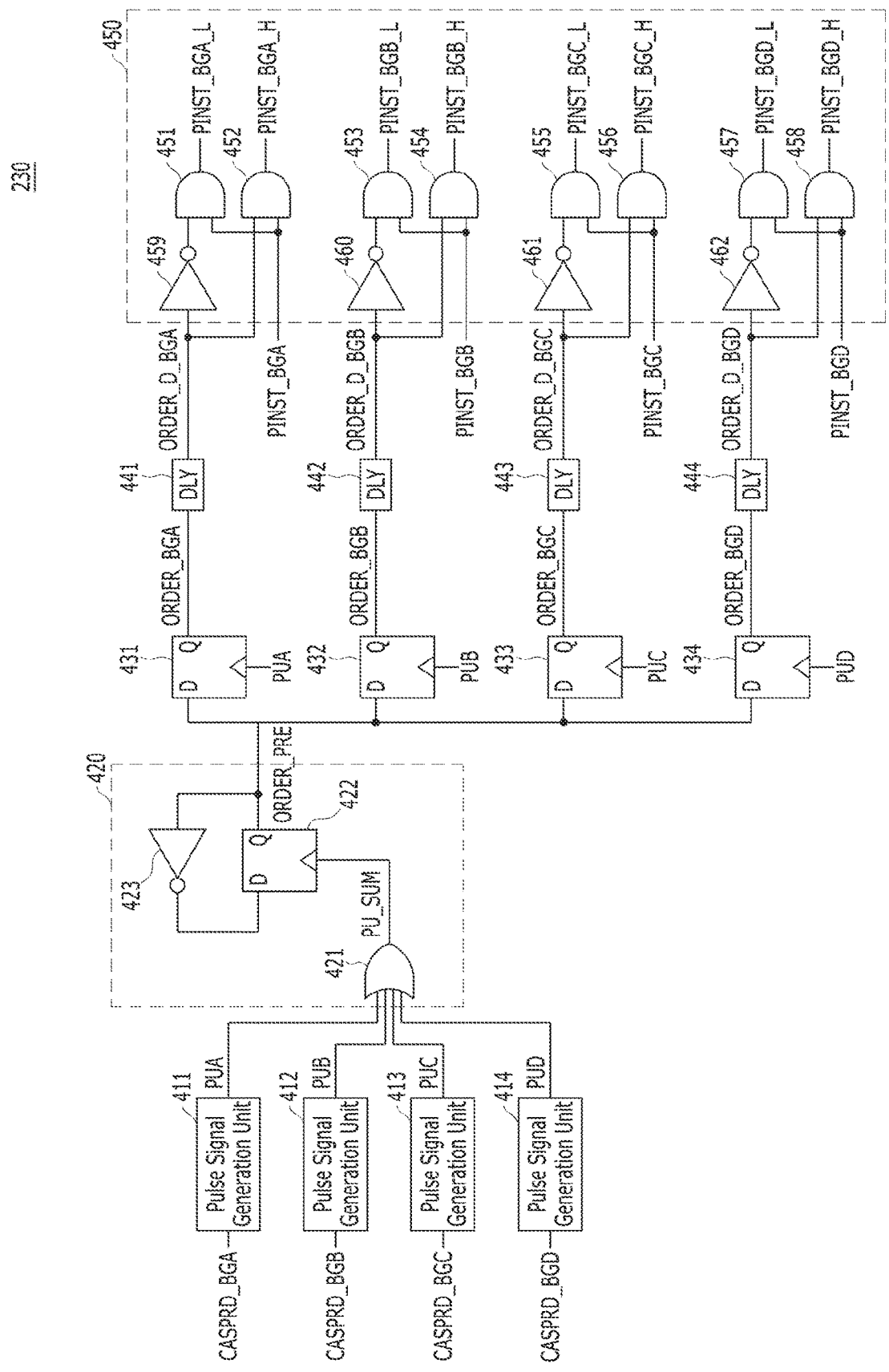
FIG. 4 is a block diagram illustrating a transfer signal generation circuit of FIG. 2.

FIG. 4 is a block diagram illustrating the transfer signal generation circuit 230 of FIG. 2.

Referring to FIG. 4, the transfer signal generation circuit 230 may include first to fourth pulse signal generation units 411 to 414, a preorder signal generation unit 420, and first to fourth order signal generation units 431 to 434, first to fourth delay units 441 to 444, and a logic combining unit 450.

The first to fourth pulse signal generation units 411 to 414 may respectively generate first to fourth pulse signals PUA to PUD that are activated when the first to fourth bank group read signals CASPRD_BGA to CASPRD_BGD are activated. The first pulse signal PUA may be a pulse signal that is simultaneously activated with the first bank group read signal CASPRD_BGA and has a shorter activation section. Similarly, the second to fourth pulse signals PUB to PUD may be pulse signals obtained by reducing an activation sections of the second to fourth bank group read signals CASPRD_BGB to CASPRD_BGD.

The pre-order signal generation unit 420 may generate a pre-order signal ORDER_PRE having a logic value that is changed whenever one among the first to fourth pulse signals PUA to PUD is activated. The pre-order signal generation unit 420 may include an OR gate 421, a D-flip flop 422, and an inverter 423. The OR gate 421 may receive the first to fourth pulse signals PUA to PUD. The pre-order signal ORDER_PRE may be outputted through an output terminal Q of the D-flop flop 422. The inverter 423 may invert the pre-order signal ORDER_PRE and transfer the inverted signal to an input terminal D of the D-flop flop 422. Also, an output signal PU_SUM of the OR gate 421 may be inputted to a clock terminal of the D-flip flop 422. When one among the first to fourth pulse signals PUA to PUD is activated, the output signal PU_SUM of the OR gate 421 may be activated and whenever the output signal PU_SUM of the OR gate 421 is activated, the logic value of the pre-order signal ORDER_PRE may be changed.

The first to fourth order signal generation units 431 to 434 may generate the first to fourth order signals ORDER_BGA to ORDER_BGD by latching the pre-order signal ORDER_PRE when the first to fourth pulse signals PUA to PUD are activated. For example, the second order signal generation unit 432 may latch the pre-order signal ORDER_PRE at a moment when the second pulse signal PUB is activated and output it as a second order signal ORDER_BGB. Each of the first to fourth order signal generation units 431 to 434 may include a D flip-flop that receives the pre-order signal ORDER_PRE at the input terminal D, and receives a signal corresponding thereto among the first to fourth pulse signals PUA to PUD at the clock terminal, and outputs an order signal corresponding thereto among the first to fourth order signals ORDER_BGA to ORDER_BGD at the output terminal Q.

The first to fourth delay units 441 to 444 may delay the first to fourth order signals ORDER_BGA to ORDER_BGD to generate first to fourth delayed order signals ORDER_D_BGA to ORDER_D_BGD. Whereas the order signals ORDER_BGA to ORDER_BGD are generated using the bank group read signals CASPRD_BGA to CASPRD_BGD, which direct read operations of the bank groups BGA to BGD, since the transfer signals PINST_BGA_L, PINST_BGA_H, PINST_BGB_L, and PINST_BGB_H, PINST_BGC_L, PINST_BGC_H, PINST_BGD_L, and PINST_BGD_H have to be used in a section in which read data are outputted from the bank groups BGA to BGD, a delay operation may be required, and the first to fourth delay units 441 to 444 may perform a delay operation. The delay values of the first to fourth delay units 441 to 444 may be as much as a time difference between the bank group read signals CASPRD_BGA to CASPRD_BGD and the bank group pinstrobe signals PINST_BGA to PINST_BGD.

When the first delayed order signal ORDER_D_BGA is activated and the first bank group pinstrobe signal PINST_BGA is activated, the logic combining unit 450 may activate the first transfer signal PINST_BGA_L. When the first delayed order signal ORDER_D_BGA is deactivated and the first bank group pinstrobe signal PINST_BGA is activated, the logic combining unit 450 may activate the second transfer signal PINST_BGA_H. When the second delayed order signal ORDER_D_BGB is activated and the second bank group pinstrobe signal PINST_BGB is activated, the logic combining unit 450 may activate the third transfer signal PINST_BGB_L. When the second delayed order signal ORDER_D_BGB is deactivated and the second bank group pinstrobe signal PINST_BDB is activated, the logic combining unit 450 may activate the fourth transfer signal PINST_BGB_H. Also, when the third delayed order signal ORDER_D_BGC is activated and the third bank group pinstrobe signal PINST_BGC is activated, the logic combining unit 450 may activate the fifth transfer signal PINST_BGC_L. When the third delayed order signal ORDER_D_BGC is deactivated and the third bank group pinstrobe signal PINST_BGC is activated, the logic combining unit 450 may activate the sixth transfer signal PINST_BGC_H. Also, when the fourth delayed order signal ORDER_D_BGD is activated and the fourth bank group pinstrobe signal PINST_BGD is activated, the logic combining unit 450 may activate the seventh transfer signal PINST_BGD_L. When the fourth delayed order signal ORDER_D_BGD is deactivated and the fourth bank group pinstrobe signal PINST_BGD is activated, the logic combining unit 450 may activate the eighth transfer signal PINST_BGD_H.

The logic combining unit 450 may include AND gates 451 to 458 and inverters 459 to 462.

Figure 5:
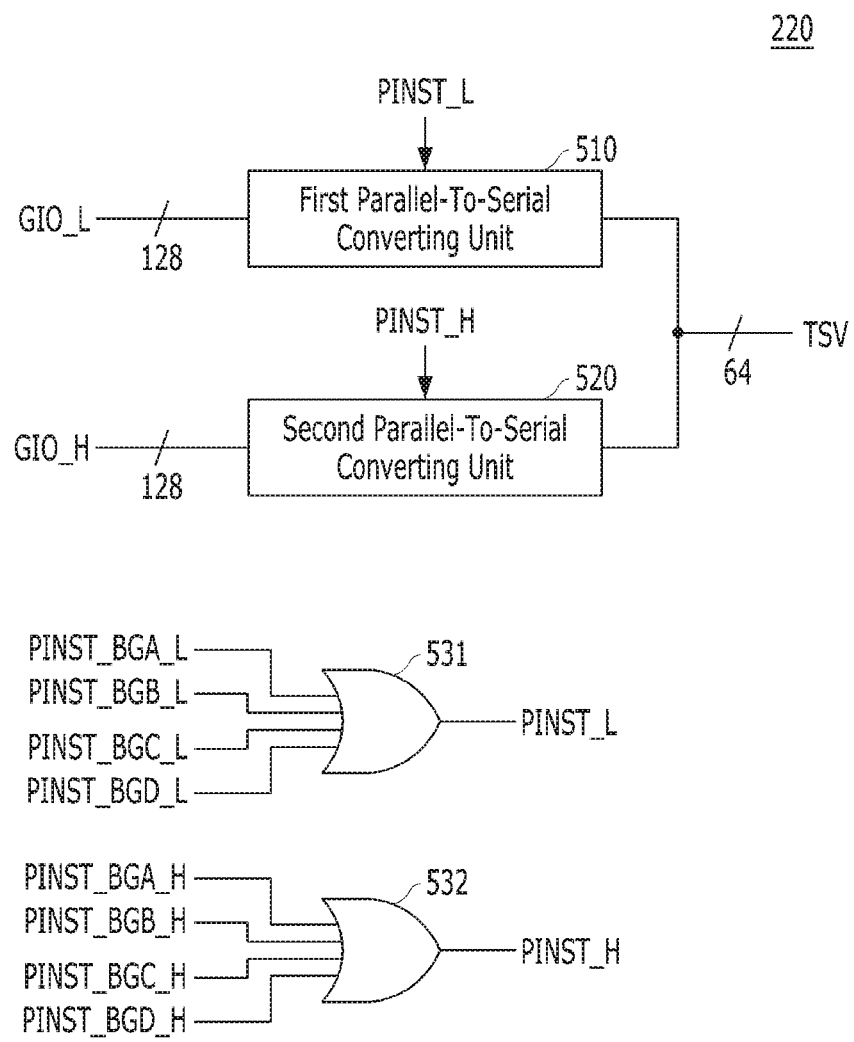
FIG. 5 is a block diagram illustrating a parallel-to-serial conversion circuit of FIG. 2.

FIG. 5 is a block diagram illustrating the parallel-to-serial conversion circuit 220 of FIG. 2.

Referring to FIG. 5, the parallel-to-serial conversion circuit 220 may include a first parallel-to-serial converting unit 510, a second parallel-to-serial converting unit 520, and OR gates 531 and 532.

The OR gate 531 may receive the first transfer signal PINST_BGA_L, the third transfer signal PINST_BGB_L, the fifth transfer signal PINST_BGC_L, and the seventh transfer signal PINST_BGD_L, and output the first signal PINST_L. The OR gate 532 may receive the second transfer signal PINST_BGA_H, the fourth transfer signal PINST_BGB_H, the sixth transfer signal PINST_BGC_H, and the eighth transfer signal PINST_BGD_H, and output the second signal PINST_H. The first signal PINST_L may be a signal for notifying that data is transferred to the first data bus GIO_L, and the second signal PINST_H may be a signal for notifying that data is transferred to the second data bus GIO_H.

The first parallel-to-serial converting unit 510 may perform a 2:1 parallel-to-serial conversion on the data of the first data bus GIO_L in response to the first signal PINST_L and transfer the converted data to the silicon through via TSV.

The second parallel-to-serial converting unit 520 may perform a 2:1 parallel-to-serial conversion on the data of the second data bus GIO_H in response to the second signal PINST_H and transfer the converted data to the silicon through via TSV.

Figure 6:
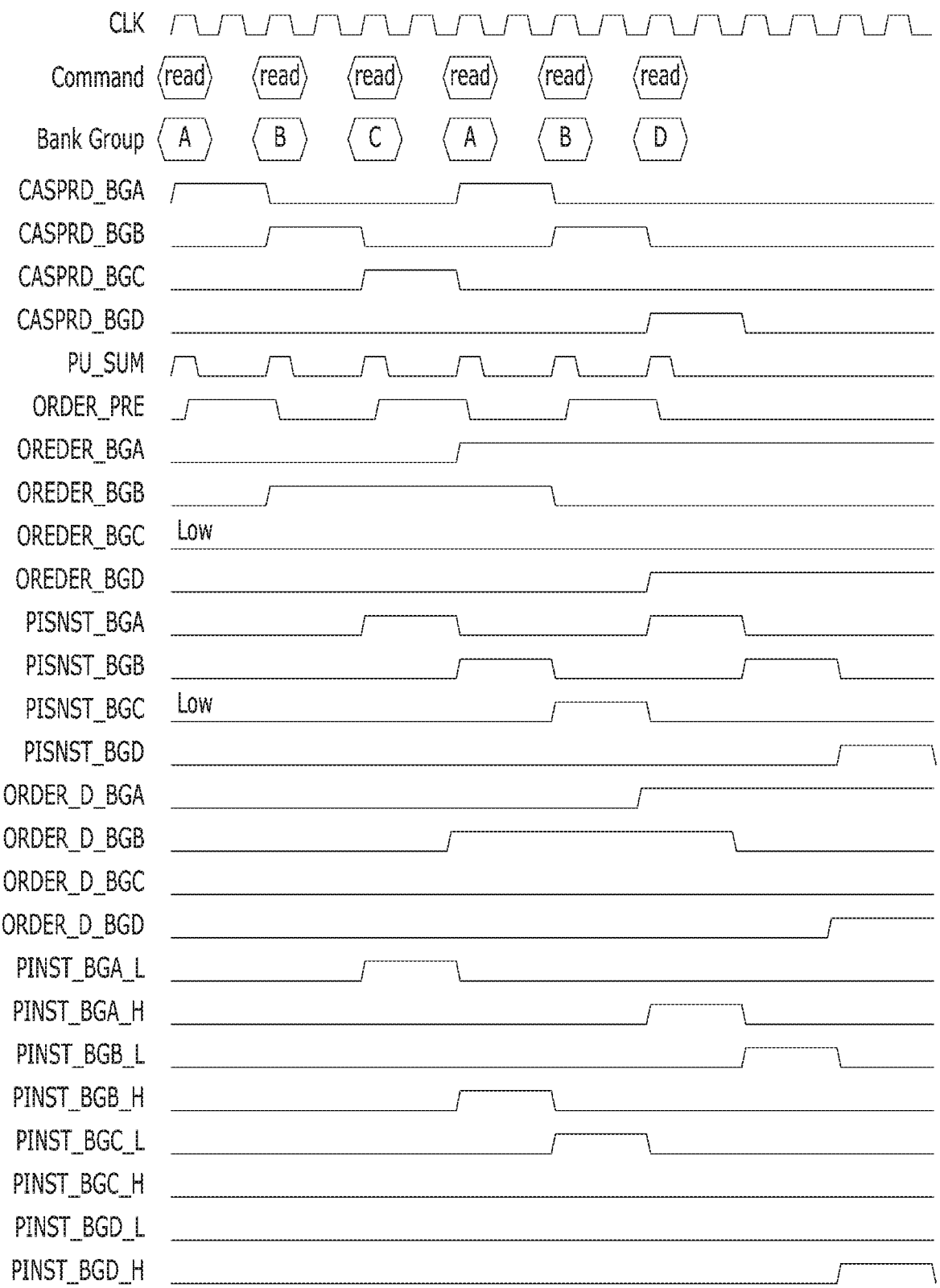
FIG. 6 illustrates an example of the overall operation of the core die of FIG. 2.

FIG. 6 shows an example of the overall operation of the core die 200 of FIG. 2.

Referring to FIG. 6, it may be seen that six read commands READ are applied to the high bandwidth memory at, for example, every two clock cycles. A bank group may be designated for each read operation, and it may be seen herein that the first bank group BGA, the second bank group BGB, the third bank group BGC, the first bank group BGA, the second bank group BGB, and the fourth bank group BGD are assigned.

Whenever a read command READ is applied, a signal corresponding to a designated bank group among the first to fourth bank group read signals CASPRD_BGA to CASPRD_BGD may be activated.

Whenever one among the first to fourth bank group read signals is activated, the output signal PU_SUM of the OR gate 421 may be activated. Whenever the output signal PU_SUM of the OR gate 421 is activated, the logic level of the pre-order signal ORDER_PRE may be changed.

When the first to fourth pulse signals PUA to PUD are activated, the pre-order signal ORDER_PRE may be latched to generate the first to fourth order signals ORDER_BGA to ORDER_BGD. First to fourth delayed order signals ORDER_D_BGA to ORDER_D_BGD may be generated by delaying the first to fourth order signals ORDER_BGA to ORDER_BGD. The fourth to eighth transfer signals PINST_BGA_L, PINST_BGA_H, PINST_BGB_L, PINST_BGB_H, PINST_BGC_L, PINST_BGC_H, PINST_BGD_L, and PINST_BGD_H may be generated by using the first to fourth bank group pinstrobe signals PINST_BGA to PINST_BGD and the first to fourth delayed order signals ORDER_D_BGA to ORDER_D_BGD.

Referring to FIG. 6, it may be seen that the transfer signals are activated in the order of the first transfer signal PINST_BGA_L, the fourth transfer signal PINST_BGB_H, the fifth transfer signal PINST_BGC_L, the second transfer signal PINST_BGA_H, the third transfer signal PINST_BGB_L, and the eighth transfer signal PINST_BGD_H. Accordingly, data of the first bank group BGA may be transferred to the first data bus GIO_L, and then data of the second bank group BGB may be transferred to the second data bus GIO_H, and then, data of the third bank group BGC may be transferred to the first data bus GIO_L, and then data of the first bank group BGA may be transferred to the second data bus GIO_H, and then data of the second bank group BGB may be transferred to the first data bus GIO_L, and then data of the fourth bank group BGD may be transferred to the second data bus GIO_H. In other words, whenever a read operation is performed, the first data bus GIO_L and the second data bus GIO_H may be alternately used.

According to the embodiments, a data bus may be efficiently used in a memory.

While the present disclosure has been described with respect to the specific embodiments, it will be apparent to those skilled in the art that various changes and modifications may be made without departing from the spirit and scope of the disclosure as defined in the following claims.

What is claimed is:

1. A memory, comprising:
a first data bus; and
a second data bus;
first, second, third, and fourth bank groups each of which includes one or more memory banks and sharing the first data bus and the second data bus; and
a bus control circuit configured for controlling a coupling between the first, second, third and fourth bank groups and the first data bus and the second data bus,
wherein the bank groups output read data by alternately using the first data bus and the second data bus during read operations of the bank groups,
wherein the bus control circuit includes:
a first transfer unit configured for transferring read data of the first bank group to the first data bus in response to a first transfer signal;
a second transfer unit configured for transferring read data of the first bank group to the second data bus in response to a second transfer signal;
a third transfer unit configured for transferring read data of the second bank group to the first data bus in response to a third transfer signal;
a fourth transfer unit configured for transferring read data of the second bank group to the second data bus in response to a fourth transfer signal;
a fifth transfer unit configured for transferring read data of the third bank group to the first data bus in response to a fifth transfer signal;
a sixth transfer unit configured for transferring read data of the third bank group to the second data bus in response to a sixth transfer signal;
a seventh transfer unit configured for transferring read data of the fourth bank group to the first data bus in response to a seventh transfer signal; and
an eighth transfer unit configured for transferring read data of the fourth bank group to the second data bus in response to an eighth transfer signal.

2. The memory of claim 1,
wherein during a one-time read operation, a read operation is performed in one bank group among the bank groups, and
whenever a read operation is performed, a data bus used for the read operation is changed between the first data bus and the second data bus.

3. The memory of claim 1, further comprising:
a parallel-to-serial conversion circuit configured for performing a parallel-to-serial conversion on the read data transferred to the first data bus and the second data bus.

4. The memory of claim 3, wherein the memory system includes a high bandwidth memory, and the first data bus, the second data bus, the bank groups, the bus control circuit, and the parallel-to-serial conversion circuit are included in a core die of the high bandwidth memory.

5. The memory of claim 4, wherein the memory further includes a logic die, and
the logic die receives the read data obtained from the parallel-to-serial conversion of the parallel-to-serial conversion circuit through a silicon through via and transfers the received read data to a memory controller.

6. A memory, comprising:
a first data bus;
a second data bus;
first, second, third, and fourth bank groups each of which includes one or more memory banks and sharing the first data bus and the second data bus; and
a bus control circuit configured for controlling a coupling between the first, second, third and fourth bank groups and the first data bus and the second data bus,
wherein one of the first, second, third and fourth bank groups transfers read data to the first data bus during a read operation based on an odd-numbered read command, and transfers one of the first, second, third and fourth bank groups read data to the second data bus during a read operation based on an even-numbered read command, and
wherein the bus control circuit includes:
a first transfer unit configured for transferring read data of the first bank group to the first data bus in response to a first transfer signal;
a second transfer unit configured for transferring read data of the first bank group to the second data bus in response to a second transfer signal;
a third transfer unit configured for transferring read data of the second bank group to the first data bus in response to a third transfer signal;
a fourth transfer unit configured for transferring read data of the second bank group to the second data bus in response to a fourth transfer signal;
a fifth transfer unit configured for transferring read data of the third bank group to the first data bus in response to a fifth transfer signal;
a sixth transfer unit configured for transferring read data of the third bank group to the second data bus in response to a sixth transfer signal;
a seventh transfer unit configured for transferring read data of the fourth bank group to the first data bus in response to a seventh transfer signal; and
an eighth transfer unit configured for transferring read data of the fourth bank group to the second data bus in response to an eighth transfer signal.

7. The memory of claim 6, further comprising:
a parallel-to-serial conversion circuit configured for performing a parallel-to-serial conversion on the read data transferred to the first data bus and the second data bus.

8. The memory of claim 7, wherein the memory is a high bandwidth memory, and the first data bus, the second data bus, the first, second, third, and fourth bank groups, the bus control circuit, and the parallel-to-serial conversion circuit are included in a core die of the high bandwidth memory.

9. The memory of claim 6, further comprising:
a transfer signal generation circuit configured for generating the first, second, third, fourth, fifth, sixth, seventh and eighth transfer signals based on first, second, third and fourth bank group read signals and first, second, third and fourth bank group pinstrobe signals.

10. The memory of claim 9, wherein the transfer signal generation circuit includes:
first, second, third, and fourth pulse signal generation units configured for generating first, second, third, and fourth pulse signals that are activated when the first, second, third, and fourth bank group read signals are activated;
a pre-order signal generation unit configured for generating a pre-order signal having a logic level that is changed whenever one or more pulse signals among the first, second, third, and fourth pulse signals are activated;
a first order signal generation unit configured for generating a first order signal having a logic level that is the same as a logic level of the pre-order signal when the first pulse signal is activated;
a second order signal generation unit configured for generating a second order signal having the same logic level as the pre-order signal when the second pulse signal is activated;
a third order signal generation unit configured for generating a third order signal having the same logic level as the pre-order signal when the third pulse signal is activated;
a fourth order signal generation unit configured for generating a fourth order signal having the same logic level as the pre-order signal when the fourth pulse signal is activated;
first, second, third, and fourth delay units configured for generating first, second, third, and fourth delayed order signals by delaying the first, second, third, and fourth order signals; and
a logic combining unit configured for generating the first, second, third, fourth, fifth, sixth, seventh and eighth transfer signals by logically combining the first, second, third, and fourth delayed order signals and the first, second, third, and fourth bank group pinstrobe signals.

11. The memory of claim 10, wherein when the first delayed order signal is activated and the first bank group pinstrobe signal is activated, the logic combining unit activates the first transfer signal;
when the first delayed order signal is deactivated and the first bank group pinstrobe signal is activated, the logic combining unit activates the second transfer signal;
when the second delayed order signal is activated and the second bank group pinstrobe signal is activated, the logic combining unit activates the third transfer signal;
when the second delayed order signal is deactivated and the second bank group pinstrobe signal is activated, the logic combining unit activates the fourth transfer signal;
when the third delayed order signal is activated and the third bank group pinstrobe signal is activated, the logic combining unit activates the fifth transfer signal;
when the third delayed order signal is deactivated and the third bank group pinstrobe signal is activated, the logic combining unit activates the sixth transfer signal;
when the fourth delayed order signal is activated and the fourth bank group pinstrobe signal is activated, the logic combining unit activates the seventh transfer signal; and
when the fourth delayed order signal is deactivated and the fourth bank group pinstrobe signal is activated, the logic combining unit activates the eighth transfer signal.

12. The memory of claim 6,
wherein the memory further includes a logic die, and the logic die receives the read data obtained from the parallel-to-serial conversion of the parallel-to-serial conversion circuit through a silicon through via and transfers the received read data to a memory controller.

\* \* \* \* \*